United States Patent
Yang

(10) Patent No.: US 11,089,693 B2
(45) Date of Patent: Aug. 10, 2021

(54) PCB STRUCTURE WITH A SILICONE LAYER AS ADHESIVE

(71) Applicants: PROLOGIUM TECHNOLOGY CO., LTD., Taoyuan (TW); PROLOGIUM HOLDING INC., Grand Cayman (KY)

(72) Inventor: Szu-Nan Yang, Taiepei (TW)

(73) Assignees: PROLOGIUM TECHNOLOGY CO., LTD., Taoyuan (TW); PROLOGIUM HOLDING INC., Grand Cayman (KY)

(*) Notice: Subject to any disclaimer, the term of this patent is extended or adjusted under 35 U.S.C. 154(b) by 229 days.

(21) Appl. No.: 16/530,613

(22) Filed: Aug. 2, 2019

(65) Prior Publication Data
US 2019/0357362 A1    Nov. 21, 2019

Related U.S. Application Data

(63) Continuation-in-part of application No. 15/141,826, filed on Apr. 29, 2016, now Pat. No. 10,826,030.
(Continued)

(30) Foreign Application Priority Data

Dec. 16, 2011    (TW) .................................. 100146896

(51) Int. Cl.
*H05K 3/38*      (2006.01)
*H05K 1/03*      (2006.01)
(Continued)

(52) U.S. Cl.
CPC ............ *H05K 3/386* (2013.01); *H01M 4/661* (2013.01); *H01M 10/425* (2013.01);
(Continued)

(58) Field of Classification Search
None
See application file for complete search history.

(56) References Cited

U.S. PATENT DOCUMENTS

| 4,087,858 A | 5/1978 | Pichler et al. |
| 4,639,285 A | 1/1987 | Suzuki et al. |
| (Continued) | | |

FOREIGN PATENT DOCUMENTS

| JP | 2000302970 A | 10/2000 |
| JP | 2001040094 A | 2/2001 |
| (Continued) | | |

*Primary Examiner* — Ula C Ruddock
*Assistant Examiner* — Tony S Chuo
(74) *Attorney, Agent, or Firm* — Rabin & Berdo, P.C.

(57) ABSTRACT

A flexible printed circuit board includes a substrate that is made of a non-metal; a first modified silicone cured layer that is provided on and in contact with the substrate and that includes a first silicone material that is cured; a metal layer that is made of at least one metal; a second modified silicone cured layer that is provided on and in contact with the metal layer and that includes a second silicone material that is cured; and a silicone adhesive layer disposed between and in contact with the first modified silicone cured layer and the second modified silicone cured layer and that includes an adhesive silicone material that is cured by being thermally polymerized after lamination thereof between the first modified silicone cured layer and the second modified silicone cured layer. Lamination of the cured modified-silicone-coated substrate and the cured modified-silicone-coated metal layer with the silicone adhesive layer improves adhesion and reduces delamination.

13 Claims, 4 Drawing Sheets

Related U.S. Application Data which is a continuation-in-part of application No. 13/708,364, filed on Dec. 7, 2012, now abandoned.

(51) Int. Cl.
*H01M 10/42* (2006.01)
*H01M 4/66* (2006.01)

(52) U.S. Cl.
CPC ..... *H05K 1/036* (2013.01); *H01M 2010/4271* (2013.01); *H05K 2201/0162* (2013.01); *H05K 2201/0195* (2013.01)

(56) References Cited

U.S. PATENT DOCUMENTS

| | | |
|---|---|---|
| 4,765,860 A | 8/1988 | Ueno et al. |
| 5,239,034 A | 8/1993 | Takago et al. |
| 6,103,788 A | 8/2000 | Harui et al. |
| 6,284,309 B1 | 9/2001 | Bishop et al. |
| 8,536,460 B2 | 9/2013 | Lin et al. |
| 2003/0145940 A1 | 8/2003 | Chaudhury et al. |
| 2003/0170446 A1 | 9/2003 | Takahashi et al. |
| 2006/0216586 A1 | 9/2006 | Tucholski |
| 2007/0037950 A1 | 2/2007 | Baba et al. |
| 2009/0056995 A1 | 3/2009 | Maeda et al. |
| 2010/0273011 A1 | 10/2010 | Zhong et al. |
| 2010/0323208 A1 | 12/2010 | Song et al. |
| 2011/0290543 A1 | 12/2011 | Takeuchi et al. |
| 2012/0045629 A1 | 2/2012 | Greer et al. |

FOREIGN PATENT DOCUMENTS

| | | |
|---|---|---|
| JP | 2003031913 A | 1/2003 |
| JP | 2009056791 A | 3/2009 |
| JP | 2009245782 A | 10/2009 |
| JP | 2009289549 A | 12/2009 |
| WO | 2010129123 A2 | 11/2010 |

PCB STRUCTURE WITH A SILICONE LAYER AS ADHESIVE

CROSS-REFERENCE TO RELATED APPLICATION

This application is a continuation-in-part (CIP) of U.S. patent application Ser. No. 15/141,826, filed on Apr. 29, 2016, and Ser. No. 13/708,364, filed on Dec. 7, 2012. The prior applications are herewith incorporated by reference in its entirety.

BACKGROUND OF THE INVENTION

Field of Invention

The present invention relates to a PCB (printed circuit board) structure, in particular to a flexible PCB structure using a silicone layer to combine the metal layer and the substrate.

Related Art

Since a flexible printed circuit board (FPC) assembly has flexibility by which the flexible printed circuit board assembly can be bent by itself, the flexible printed circuit board assembly has been used in various kinds of electrical appliances. For example, a flexible printed circuit board can be installed between a main body and an openable display unit of a notebook computer to transmit an electrical signal between the main body and the display unit, or can be installed between a main body and a movable pickup assembly of an optical disc drive in a computer to transmit a signal therebetween.

A flexible copper clad laminate (FCCL) is mainly used in the manufacture of FPC. The FCCL is manufactured by gluing a metallic foil such as a copper foil to the surface of a heat-resistant film represented by a polyimide film via an adhesive formed of an epoxy system resin adhesive, such as epoxy resin, polyester, or acrylic resin. The FCCL is normally produced by hot-pressing the layered structure at around 180 degrees C.°. Since the main chain of the epoxy system resin adhesive is rigid, problems such as warping of the laminate itself are encountered during the hot-pressing.

To solve this problem, the adhesive layer of the above three-layer flexible copper clad laminate is eliminated, which is why it is called "two-layer flexible copper clad laminate" (2L FCCL). It is manufactured by a casting method, sputtering method, or lamination method to form the copper foil on the surface of the substrate film represented by a polyimide (PI) film.

However, because of the characteristic of the material, the FCCL, including three-layer and two-layer, has low ion-migration resistance. The material of the substrate, polyimide, and the adhesive, such as epoxy resin, or acrylic resin, have high polarity and are hydrophilic. For example, the FCCL is utilized in fine pitch wiring and high voltage appliances, such as LCD (liquid crystal display), OLED (Organic Light-Emitting Diode), or plasma display. Please refer to FIG. 1, it shows a three-layer flexible copper clad laminate. A first lead 43 and a second lead 44 are formed on the adhesive layer 41, 42 and the substrate 40. During the high voltage operation, these devices are known to have the drawback that a short distance S between leads 43, 44 causes an ion migration phenomenon in the copper used as the wiring or electrode. It often results in electrical failures such as increased leakage current flow and short-circuiting between leads 43, 44. On the other hand, for the two-layer flexible copper clad laminate, the substrate, PI, also has high polarity and is hydrophilic, so the drawback of ion migration phenomenon still exists.

SUMMARY OF THE INVENTION

It is an objective of this invention to provide a flexible PCB structure. The silicone is utilized as the adhesive between the metal layer and the substrate. The silicone is sufficiently soft to absorb the deformation due to heat-shrink to prevent warping and bending during high temperature processing.

Another objective of this invention is to provide a flexible PCB structure. The ion-migration resistance is raised. The problems of unclear signal and voltage drop caused by moisture are overcome due to the non-polar and non-hydrophile characteristic of silicone.

It is an objective of this invention to provide a flexible PCB structure. The silicone adhesive layer has two modified silicone cured layers disposed two sides thereon to enhance the adhesion between the silicone and substrate/metal layer. This solves the problems of bubbles or the substrate easily peeling off.

This invention discloses a flexible PCB structure. The PCB structure includes a substrate, a silicone adhesive layer, and a metal layer. The silicone adhesive layer is disposed on the substrate and utilized to adhere the metal layer to the substrate. The silicone adhesive layer is sufficiently soft to absorb the deformation of the metal and the substrate due to heat-shrinkage to prevent warping and bending during high temperature processing. Due to the non-polar and non-hydrophile characteristics of the silicone adhesive layer, the problems caused by high polarity and hydrophilic material, such as polyimide (PI), epoxy resin, or acrylic resin, are solved. The ion-migration resistance of this PCB structure is raised. The problems of unclear signal and voltage drop caused by moisture are overcome due to the non-polar and non-hydrophile characteristics of silicone.

Furthermore, to enhance the adhesion between the silicone and substrate/metal layer, the silicone adhesive layer has two modified silicone cured layers disposed on two sides. Both the two modified silicone cured layers mainly contain a chemical formula I of:

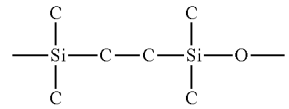

The silicone adhesive layer mainly contains a chemical formula II of:

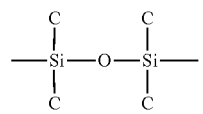

The first modified silicone cured layer, the second modified silicone cured layer and the silicone adhesive layer contain the chemical formula I and the chemical formula II. This solves the problems of bubbles or the substrate easily peeling off. The interfacial tension and the polarity of silicone are modified of the modified silicone cured layer to enhance the adhesion for different materials.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Silicones are synthetic compounds with a variety of forms and uses. Typically heat-resistant and rubber-like, they are used in sealants, adhesives, lubricants, medical applications, cookware, and insulation. Some of the most useful properties of silicones include low thermal conductivity, low chemical reactivity, low toxicity, and thermal stability. Also, silicones have excellent resistance to oxygen, ozone, and ultraviolet (UV) light and good electrical insulation. Because silicone can be formulated to be electrically insulative or conductive, it is suitable for a wide range of electrical applications. Silicone exhibits good fluidity and adhesion when melting, and is sufficiently soft after being cured. Also, silicone is non-polar and non-hydrophilic. Therefore, it is suitable to replace epoxy resin as adhesive material.

Figure 2:
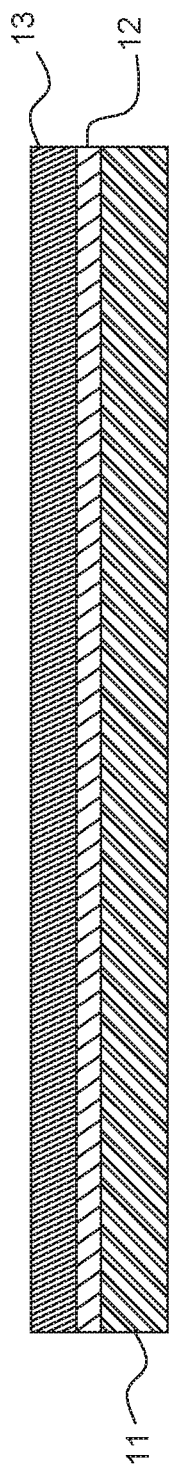
FIG. 2 illustrates the PCB structure of this present invention.

Please see FIG. 2, the flexible PCB (printed circuit board) structure includes a substrate 11, a silicone adhesive layer 12 and a metal layer 13. The material of the substrate 11 includes polyimide (PI), polyethylene terephthalate (PET), polyethylene naphthalate (PEN), glass, glass fiber, and liquid crystal polymer to form a flexible PCB or an inflexible PCB. The silicone adhesive layer 12 is disposed between the substrate 11 and the metal layer 13 to act as adhesive. The silicone exhibits good fluidity and adhesion when melted. It is suitable to serve as an adhesive. For example, the silicone may be disposed on the substrate 11 by coating to form the silicone adhesive layer 12. The metal layer 13 may be disposed on the silicone adhesive layer 12 and then cured by a baking process. After being cured, the silicone adhesive layer 12 is sufficiently soft to act as a buffer to absorb deformation due to heat-shrinkage between the metal layer 13 and the substrate 11 to prevent warping and bending during high temperature processing. The wiring may be formed on the metal layer 13 by etching or other processing. The further protective layer, solder mask, etc. may also be formed thereon. The material of the metal layer 13 is copper (Cu), aluminum (Al), nickel (Ni), gold (Au), silver (Ag), tin (Sn) or an alloy comprised of at least one of the foregoing metals.

Figure 3:
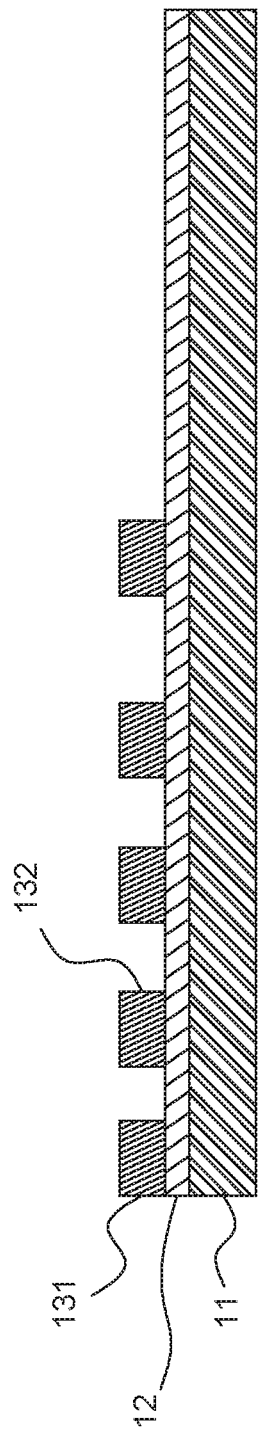
FIG. 3 illustrates the PCB structure according to the present invention when utilized in fine pitch wiring and high voltage appliances.

Moreover, the silicone is non-polar and non-hydrophilic. With reference to FIG. 3, when the PCB structure is utilized in a fine pitch wiring or high voltage appliance, such as LCD (liquid crystal display), OLED (Organic Light-Emitting Diode), or plasma display, at least one first lead 131 and one second lead 132 are formed on the metal layer 13. Unlike a conventional PCB structure, the silicone adhesive layer 12 is non-polar and non-hydrophilic. Even though the substrate 11 represented by a polyimide (PI) is high polarity and hydrophilic, the silicone adhesive layer 12 will stop the ion migration phenomenon between the first lead 131 and the second lead 132. The problems of unclear signal and voltage drop will not occur.

Figure 1:
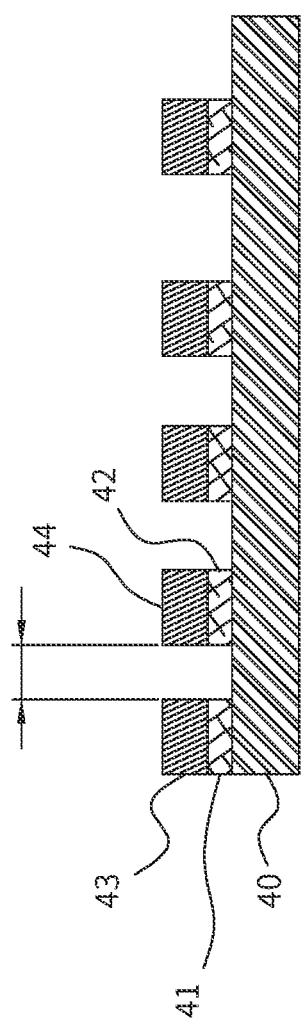
FIG. 1 illustrates an example of the conventional PCB structure when utilized in fine pitch wiring and high voltage appliances.
Figure 4:
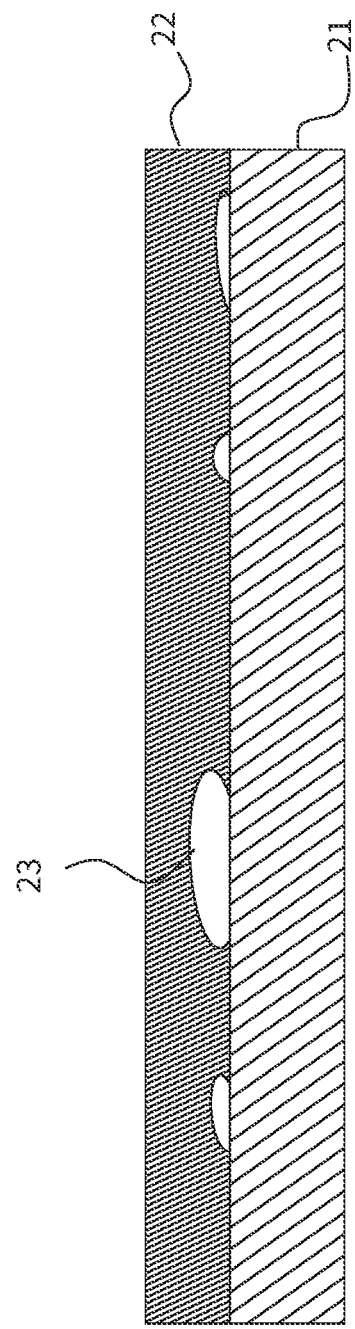
FIG. 4 illustrates the example of the conventional coating silicone adhesive layer.

However, the silicone has a problem with adhesion. The silicone will undergo both condensation reaction and addition reaction during curing. The structure cured by a condensation reaction has less adhesive force than an addition reaction. Also the byproduct of the condensation reaction is hydrogen, which may easily produce bubbles. With reference to FIG. 4, the silicone adhesive layer 22 is disposed on the substrate 21 with different material. During polymerization, the gas, i.e. hydrogen, moves randomly. When blocked by the substrate 21, due to the substrate 21 being made of compact material, such as metal, glass, or polymer, the gas collects to form bubbles 23 at the interface therebetween. When there are bubbles 23 at the interface, the structure is easy to peel off.

General speaking, the silicone is utilized in filling. In other words, one side of the silicone adhesive layer 22 is free, as shown in FIG. 4. If the gas produced can be exhausted slowly. However, in this invention, the silicone adhesive layer 12 is placed between the substrate 11 and the metal layer 13, as shown in FIG. 2. Hot pressing or thermal polymerization is required for curing. That will produces more gas. When the randomly moving gas is moved randomly and blocked by the substrate 11 and the metal layer 13. The merged gas bubbles would destroy the adhesion interface therebetween. Also, the gas bubbles will merge to form larger to further weaken the adhesion.

Figure 5:
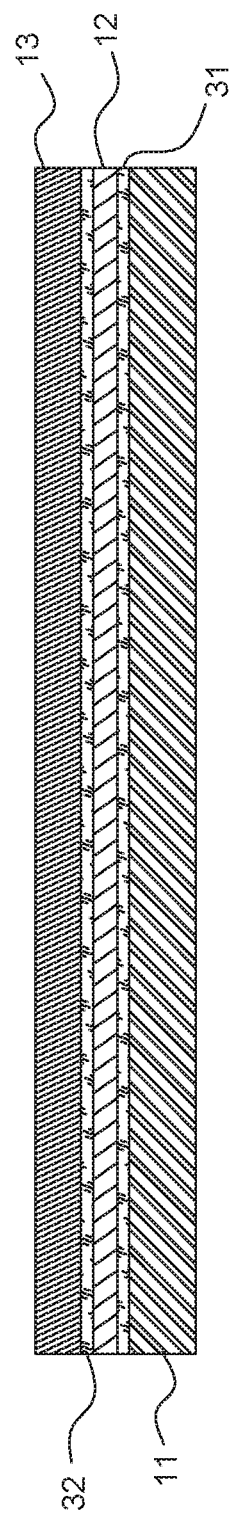
FIG. 5 illustrates another embodiment of the PCB structure according to the present invention.

Please refer to FIG. 5. To solve this problem, the silicone adhesive layer 12 has two modified silicone cured layers 31, 32 disposed on two sides thereof. The first modified silicone cured layer 31 is disposed between the silicone adhesive layer 12 and the substrate 11. The second modified silicone cured layer 32 is disposed between the silicone adhesive layer 12 and the metal layer 13. The interfacial tension and the polarity of silicone of the modified silicone cured layers 31, 32 are modified, depending on the materials of the substrate 11 and the metal layer 13, to enhance the adhesion for different materials. Therefore, the good adhesion situations are presented on the interfaces between the first modified silicone cured layer 31 and the substrate 11, and the second modified silicone cured layer 32 and the metal layer 13. Also, the amount and size of gas bubbles produced are reduced.

Both the first modified silicone cured layer 31 and the second modified silicone cured layer 32 mainly contain a chemical formula I of:

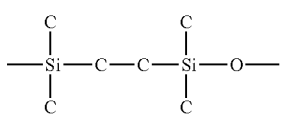

The silicone adhesive layer 12 mainly contains a chemical formula II of:

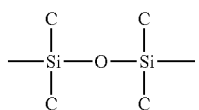

All the first modified silicone cured layer 31, the second modified silicone cured layer 32 and the silicone adhesive layer 12 contain both the chemical formula I and the chemical formula II.

Amounts of the chemical formula II within the silicone adhesive layer 12 is greater than amounts of the chemical formula I within the silicone adhesive layer 12. Amounts of the chemical formula I within each of the first modified silicone cured layer 31 and the second modified silicone cured layer 32 is greater than amounts of the chemical formula II within each of the first modified silicone cured layer 31 and the second modified silicone cured layer 32.

Also, amounts of the chemical formula II within the silicone adhesive layer 12 is greater than amounts of the chemical formula II within each of the first and the second modified silicone cured layers 31, 32 by 0.1% to 60%, on a weight/volume basis.

The modified silicone cured layers 31, 32 are modified by increasing a proportion of addition-type silicone and/or by adding epoxy, acrylic acid or a combination thereof into silicone.

As an example of the forming method, the modified silicone cured layers 31, 32 are formed on the substrate 11 and the metal layer 13 respectively to modify of surface characteristics of the substrate 11 and the metal layer 13 to enhance bonding ability with the silicone adhesive layer 12 in the subsequent process. In the other words, the modified silicone cured layers 31, 32 can be considered as the surface-modified layer of the substrate 11 and the metal layer 13 respectively. Then the polymerization is performed slowly for curing. Since one side is free and the slowly curing process is performed, the produced gas can be exhausted. Also, the modified silicone cured layers 31, 32 are modified depending on the materials of the substrate 11 and the metal layer 13. The good adhesion situations are presented on the interfaces between the first modified silicone cured layer 31 and the substrate 11, and the second modified silicone cured layer 32 and the metal layer 13.

The silicone adhesive layer 12 is disposed on either the first modified silicone cured layer 31 or the second modified silicone cured layer 32. Then, the substrate 11 and the metal layer 13, together with the silicone adhesive layer 12, the first modified silicone cured layer 31 and the second modified silicone cured layer 32, are combined. This polymerization is performed in two stages to bond together firmly. The heat treatment temperature of first stage is lower than the heat treatment temperature of second stage. The heat treatment duration of first stage is longer than the heat treatment duration of second stage. During the lower temperature of the first stage, the chemical formula II of the silicone adhesive layer 12 is the dominant component to form a crystalline structure in the silicone adhesive layer 12. Due to the thickness of the silicone adhesive layer 12 is thin, the crystalline structure is essentially regarded as the main moisture-blocking structure of the silicone adhesive layer 12. The crystalline structure can enhance the moisture-blocking ability of the interfaces between the silicone adhesive layer 12 and any one of the first modified silicone cured layer 31 and the second modified silicone cured layer 32. It is very important capability for the PCB when serving as a component of a battery. For example, part of the metal layer of the PCB may be directly used to serve as a current collector of the lithium battery.

During the higher temperature of the second stage, the chemical formula I of the silicone adhesive layer 12 is the dominant component and has better bonding ability than the chemical formula II. Therefore, the silicone adhesive layer 12 and the first modified silicone cured layer 31, and the silicone adhesive layer 12 and the first modified silicone cured layer 31 are bonded together firmly. Preferably, the heat treatment temperature of first stage is lower than the heat treatment temperature of second stage by 30 to 70 degrees C.°. The heat treatment duration of first stage is longer than the heat treatment duration of second stage by 80 to 300 seconds. To prevent the silicone adhesive layer 12 to be deformed during above-mentioned process, the silicone adhesive layer 12 further includes a spacer. The spacer includes silicon dioxide particles, titanium oxide particles or a combination thereof.

Since the silicone adhesive layer 12 is disposed between the modified silicone cured layers 31, 32, which are made of the same or substantially the same material, the adhesion force therebetween is high. Even though gas is produced, the adhesion structure is not easily weakened. Also, silicone is not as dense as the substrate 11 or the metal layer 13. In micro-view, the silicone has larger hole inside than the materials of the substrate 11 or the metal layer 13. Even though the silicone adhesive layer 12 is disposed between the modified silicone cured layers 31, 32 for curing, the produced gas is easily exhausted from the modified silicone cured layers 31, 32, and does not readily collect to form bubbles. The intermolecular forces between the silicone adhesive layer 12 and the modified silicone cured layers 31, 32 are equal. The gas flows inside are uniform. The gas bubbles will not easily merge to form larger ones. Therefore, the good adhesion situations are presented on the interfaces between the modified silicone cured layers 31, 32 and the silicone adhesive layer 12. Based on the above reasons, the interfaces between the first modified silicone cured layer 31 and the substrate 11, and the second modified silicone cured layer 32 and the metal layer 13 are secured better interface adhesion than the conventional interfaces.

The thickness of the modified silicone cured layers 31, 32 are varied depending on the flexible requirement, such as a bending ability of the PCB. General speaking, the thickness of the modified silicone cured layers 31, 32 have to be more than 10 µm to demonstrate flexible characteristics. Therefore, the thickness of the modified silicone cured layers 31, 32 are 10 µm to 50 µm, preferably.

The silicone adhesive layer 12 is served as a bonding layer in the invention and its thickness is a setting value, not varied depending on the flexible requirement of the PCB. The thickness of the silicone adhesive layer 12 is 5 µm to 25 µm. When the thickness of the silicone adhesive layer 12 is too thin, i.e. thinner than 5 µm, the adhesion will be too weak. When the thickness of the silicone adhesive layer 12 is too thick, i.e. thicker than 25 µm, the mechanical strength of the adhesive layer material itself cannot be ignored. It is considered to be included in the mechanical stress of the entire printed circuit board structure, which would be loss of meanings as an adhesive layer only. Further, the silicone adhesive layer 12 is cured at two closed-ends. The moisture barrier effect would be worse when the thickness of the silicone adhesive layer 12 is too thick.

Figure 6A:
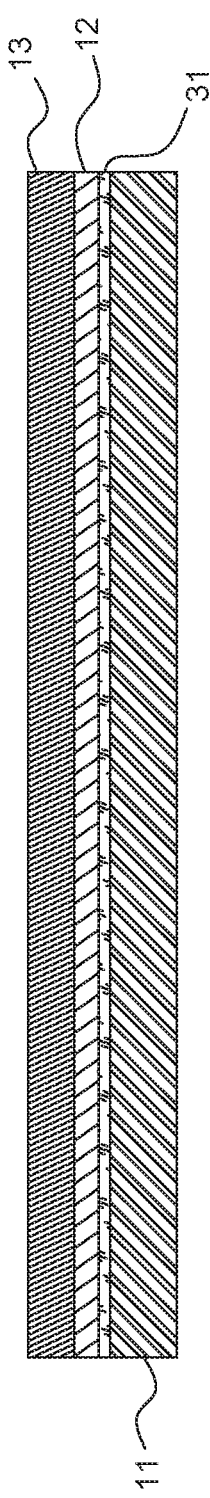
FIGS. 6A and 6B illustrate embodiments of the PCB structure of this present invention, in which only one modified silicone cured layer is disposed.
Figure 6B:
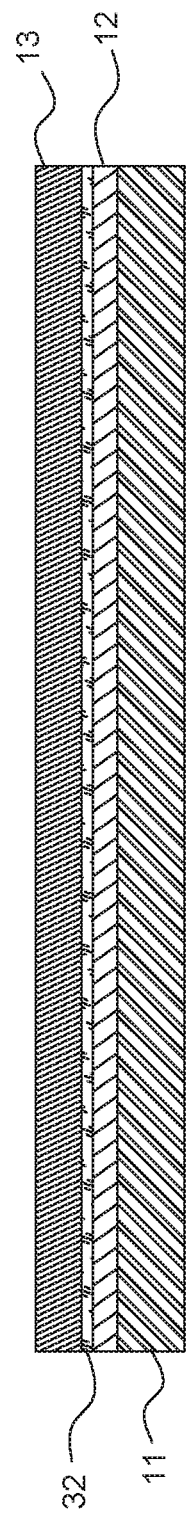

Moreover, it may be only one modified silicone cured layer to be disposed on the interfaces, which the adhesion situation is worse. For example, it only has the first modified silicone cured layer 31 to be disposed between the substrate 11 and the silicone adhesive layer 12, see FIG. 6A. Or, it only has the second modified silicone cured layer 32 to be disposed between the metal layer 13 and the silicone adhesive layer 12, see FIG. 6B.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A flexible printed circuit board structure, comprising:
   a metal layer consisting of at least one metal;
   a non-metal substrate made of different materials from that of the metal layer;
   a first modified silicone cured layer directly formed on the non-metal substrate;
   a second modified silicone cured layer directly formed on the metal layer, wherein both the first modified silicone cured layer and the second modified silicone cured layer mainly contain a chemical formula I of:

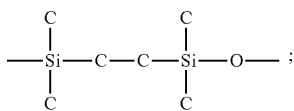

and
   a silicone adhesive layer directly bonded to the second modified silicone cured layer and the first modified silicone cured layer, and the silicone adhesive layer mainly contains a chemical formula II of:

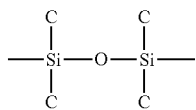

wherein the first modified silicone cured layer, the second modified silicone cured layer and the silicone adhesive layer contain the chemical formula I and the chemical formula II.

2. The flexible printed circuit board of claim 1, wherein the material of the non-metal substrate includes polyimide (PI), polyethylene terephthalate (PET), polyethylene naphthalate (PEN), glass, glass fiber, and liquid crystal polymer.

3. The flexible printed circuit board of claim 1, wherein the material of the metal layer is copper, aluminum, nickel, gold, silver, tin or an alloy comprised of at least one of the foregoing metals.

4. The flexible printed circuit board of claim 1, wherein a thickness of the silicone adhesive layer is 5 μm to 25 μm.

5. The flexible printed circuit board of claim 1, wherein a thickness of the first modified silicone cured layer is 10 μm to 50 μm.

6. The flexible printed circuit board of claim 1, wherein a thickness of the second modified silicone cured layer is 10 μm to 50 μm.

7. The flexible printed circuit board structure of claim 1, wherein the first and the second modified silicone cured layers are modified by increasing a proportion of addition-type silicone.

8. The flexible printed circuit board structure of claim 1, wherein the first and the second modified silicone cured layers are modified by adding epoxy, acrylic acid or a combination thereof into silicone.

9. The flexible printed circuit board structure of claim 1, wherein the silicone adhesive layer further comprises a spacer, wherein the spacer includes silicon dioxide particles, titanium oxide particles or a combination thereof.

10. The flexible printed circuit board structure of claim 1, wherein amounts of the chemical formula II within the silicone adhesive layer is greater than amounts of the chemical formula II within each of the first and the second modified silicone cured layers by 0.1% to 60%, on a weight/volume basis.

11. The flexible printed circuit board structure of claim 1, wherein the silicone adhesive layer has a moisture-blocking crystalline structure.

12. The flexible printed circuit board structure of claim 1, wherein part of the metal layer is served as a current collector of a battery.

13. The flexible printed circuit board structure of claim 1, wherein the thickness of the silicone adhesive layer is a setting value and the setting value is not varied depending on a flexible requirement of the flexible printed circuit board structure.

* * * * *